US009318701B2

(12) United States Patent
Karpov et al.

(10) Patent No.: US 9,318,701 B2
(45) Date of Patent: Apr. 19, 2016

(54) LOW VOLTAGE EMBEDDED MEMORY HAVING CATIONIC-BASED CONDUCTIVE OXIDE ELEMENT

(71) Applicants: Elijah V. Karpov, Santa Clara, CA (US); Brian S. Doyle, Portland, OR (US); Charles C. Kuo, Hillsboro, OR (US); Robert S. Chau, Portland, OR (US)

(72) Inventors: Elijah V. Karpov, Santa Clara, CA (US); Brian S. Doyle, Portland, OR (US); Charles C. Kuo, Hillsboro, OR (US); Robert S. Chau, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/930,393

(22) Filed: Nov. 2, 2015

(65) Prior Publication Data

US 2016/0056374 A1 Feb. 25, 2016

Related U.S. Application Data

(62) Division of application No. 13/686,507, filed on Nov. 27, 2012, now Pat. No. 9,224,461.

(51) Int. Cl.
*G11C 11/00* (2006.01)
*H01L 45/00* (2006.01)
*G11C 13/00* (2006.01)

(52) U.S. Cl.
CPC .......... *H01L 45/085* (2013.01); *G11C 13/0007* (2013.01); *H01L 45/1266* (2013.01)

(58) Field of Classification Search
CPC ...................................................... G11C 11/00
USPC ............ 365/46, 94, 100, 113, 129, 148, 163; 257/2–5, 9, 296, 310, E21.35, E31.047, 257/E27.006; 438/29, 95, 96, 166, 135, 438/240, 785, 259, 365, 482, 486, 597; 977/754
See application file for complete search history.

(56) References Cited

U.S. PATENT DOCUMENTS

| | | | |
|---|---|---|---|
| 6,642,539 B2* | 11/2003 | Ramesh et al. | 257/43 |
| 2003/0062553 A1* | 4/2003 | Ramesh et al. | 257/295 |
| 2006/0109708 A1 | 5/2006 | Pinnow et al. | |
| 2010/0259970 A1 | 10/2010 | Toda et al. | |
| 2011/0031467 A1 | 2/2011 | Kubo et al. | |
| 2011/0182108 A1 | 7/2011 | Williams et al. | |
| 2012/0243307 A1 | 9/2012 | Takashima | |
| 2012/0280224 A1 | 11/2012 | Doolittle et al. | |

FOREIGN PATENT DOCUMENTS

WO   WO-2012151566   11/2012

OTHER PUBLICATIONS

International Search Report and Written Opinion for PCT Patent Application No. PCT/US2013/047418 mailed Sep. 30, 2013, 12 pgs.

(Continued)

*Primary Examiner* — Harry W Byrne
(74) *Attorney, Agent, or Firm* — Blakely, Sokoloff, Taylor & Zafman LLP

(57) ABSTRACT

Low voltage embedded memory having cationic-based conductive oxide elements is described. For example, a material layer stack for a memory element includes a first conductive electrode. A cationic-based conductive oxide layer is disposed on the first conductive electrode. The cationic-based conductive oxide layer has a plurality of cation vacancies therein. A second electrode is disposed on the cationic-based conductive oxide layer.

20 Claims, 5 Drawing Sheets

(56) References Cited

OTHER PUBLICATIONS

International Preliminary Report on Patentability from PCT/US2013/047418 mailed Jun. 11, 2015, 9 pgs.

Office Action and Search Report from Taiwan Patent Application No. 102139956 mailed Jan. 21, 2016, 5 pgs.

* cited by examiner

LOW VOLTAGE EMBEDDED MEMORY HAVING CATIONIC-BASED CONDUCTIVE OXIDE ELEMENT

CROSS-REFERENCE TO RELATED APPLICATIONS

This application is a divisional of U.S. patent application Ser. No. 13/686,507, filed on Nov. 27, 2012, the entire contents of which are hereby incorporated by reference herein.

TECHNICAL FIELD

Embodiments of the invention are in the field of memory devices and, in particular, low voltage embedded memory having cationic-based conductive oxide elements.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change, known as RRAM/ReRAM, typically operates at voltages greater than 1V, typically requires a high voltage (>1V) forming step to form a filament, and typically have high resistance values limiting read performance. For low voltage non-volatile embedded applications, operating voltages less than 1V and compatible with CMOS logic processes may be desirable.

Thus, significant improvements are still needed in the area of nonvolatile device manufacture and operation.

DESCRIPTION OF THE EMBODIMENTS

Low voltage embedded memory having cationic-based conductive oxide elements is described. In the following description, numerous specific details are set forth, such as specific cationic-based conductive oxide material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to low voltage cationic conductive oxide random access memory (RAM) for embedded non-volatile memory (e-NVM) applications.

More generally, one or more embodiments of described herein are directed to structures for and approaches to using low voltage embedded memory. The memory is based on cationic-based conductive oxide and electrode stacks. Applications of such memory may include, but are not limited to, back end memory, embedded memory, resistive memory, random access memory, non-volatile memory, and RRAM. In one or more embodiments, the structural architecture of the memory is based on a junction-free arrangement, in that a non-conducting layer is not used in the functional element of the memory stack.

Specifically, one or more embodiments include fabrication of a memory stack having a conductive oxide layer based on cationic conductivity versus an oxide-based resistive change memories where programming is driven by anionic conductivity through oxygen vacancy generation. By basing a memory element on a cationic-based conductive oxide, instead of an anionic-based conductive oxide, faster programming operations may be achieved. Such increase in performance may be based, at least partly, on the observation that ionic conductivities are much higher for cationic conductive oxides versus anionic conductive oxides, e.g., the ionic conductivity for lithium silicate ($Li_4SiO_4$, a cationic-based oxide) is greater that that of zirconia ($ZrO_2$ or $ZrO_x$, an anionic-based oxide.

More specifically, in an embodiment, a cationic-based metal-conductive oxide-metal (MCOM) structure is implemented to fabricate a resistance change memory (often referred as RRAM) based architecture, e.g., instead of a metal-dielectric (insulating) oxide-metal (MIM) based structure. The latter type is conventionally used for state of the art RRAM devices. For example, a conventional RRAM device may be based on a metal-$HfO_x$-metal structure.

Figure 1:
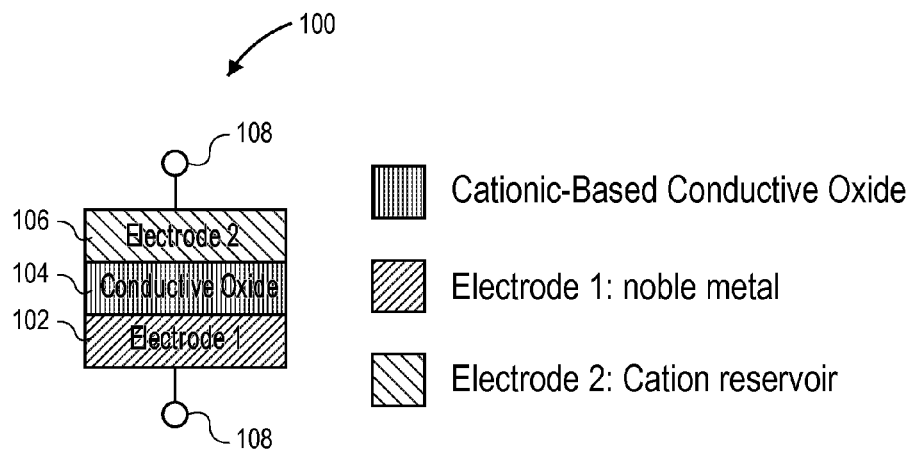
FIG. 1 illustrates a cationic-based metal-conductive oxide-metal (MCOM) memory element, in accordance with an embodiment of the present invention.

To illustrate concepts described herein, FIG. 1 illustrates a cationic-based metal-conductive oxide-metal (MCOM) memory element, in accordance with an embodiment of the present invention. Referring to FIG. 1, a memory element 100 includes a first electrode 102, a cationic-based conductive oxide layer 104, and a second electrode 106. The memory element 100 may be included in a memory architecture via nodes 108. For example, such a device may be placed between a bitline and a selector element such as a 1T (MOS transistor), or 2-terminal thin film selector which is connected to a wordline. In a particular embodiment, as indicated by the reference scheme in FIG. 1 to the right of memory element 100, the conductive oxide layer 104 is a cationic-based conductive oxide layer (e.g., having a thickness approximately in the range of 1-10 nanometers), the first electrode 102 is composed of a noble metal, and the second electrode 106 is reservoir cation reservoir (also referred to herein as an intercalation electrode), as will be described in greater detail below.

Figure 2:
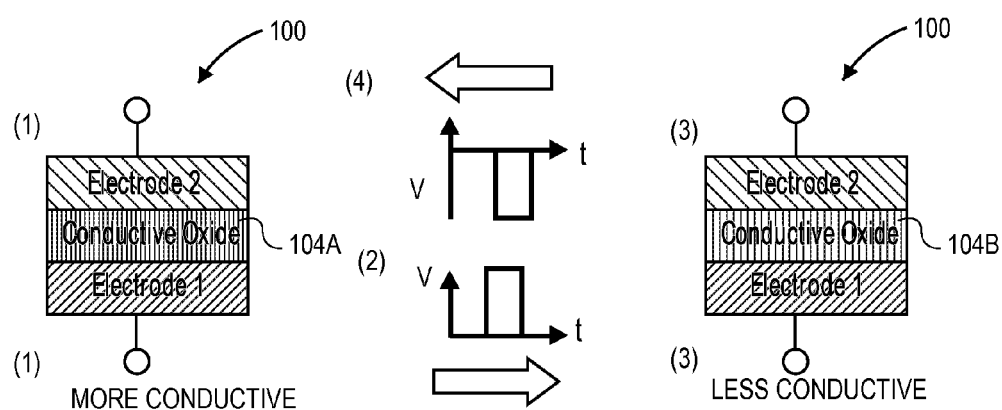
FIG. 2 illustrates an operational schematic representing a changing of states for the memory element of FIG. 1, in accordance with an embodiment of the present invention.

FIG. 2 illustrates an operational schematic representing a changing of states for the memory element of FIG. 1, in accordance with an embodiment of the present invention. Referring to FIG. 2, memory element 100 may begin in a more conductive state (1), with cationic-based conductive oxide layer 104 being in a more conductive state 104A. An electrical pulse, such as a duration of a positive bias (2) may be applied to provide memory element 100 in a less conductive state (3), with cationic-based conductive oxide layer 104 being in a less conductive state 104B. An electrical pulse, such as a duration of a negative bias (4) may be applied to again provide memory element 100 having the more conductive state (1). Thus, electrical pulsing may be used to change resistance of the memory element 100. Polarity applied is such as to attract active cations of in the memory layer to the intercalation electrode under negative bias.

Thus, in an embodiment, a memory element includes a cationic-based conductive oxide layer sandwiched between two electrodes. Resistivity of the cationic-based conductive oxide layer in low field (when device is read) is, in some embodiments, can be as low as found typical of conductive films of metal compounds, e.g. TiAlN. For example, in a specific embodiment, the resistivity for such a layer is approximately in the range of 0.1 Ohm cm-10 kOhm cm when measured at low field. Resistivity of the film is tuned depending in the memory element size to achieve final resistance value in the range compatible with fast read.

Figure 3:
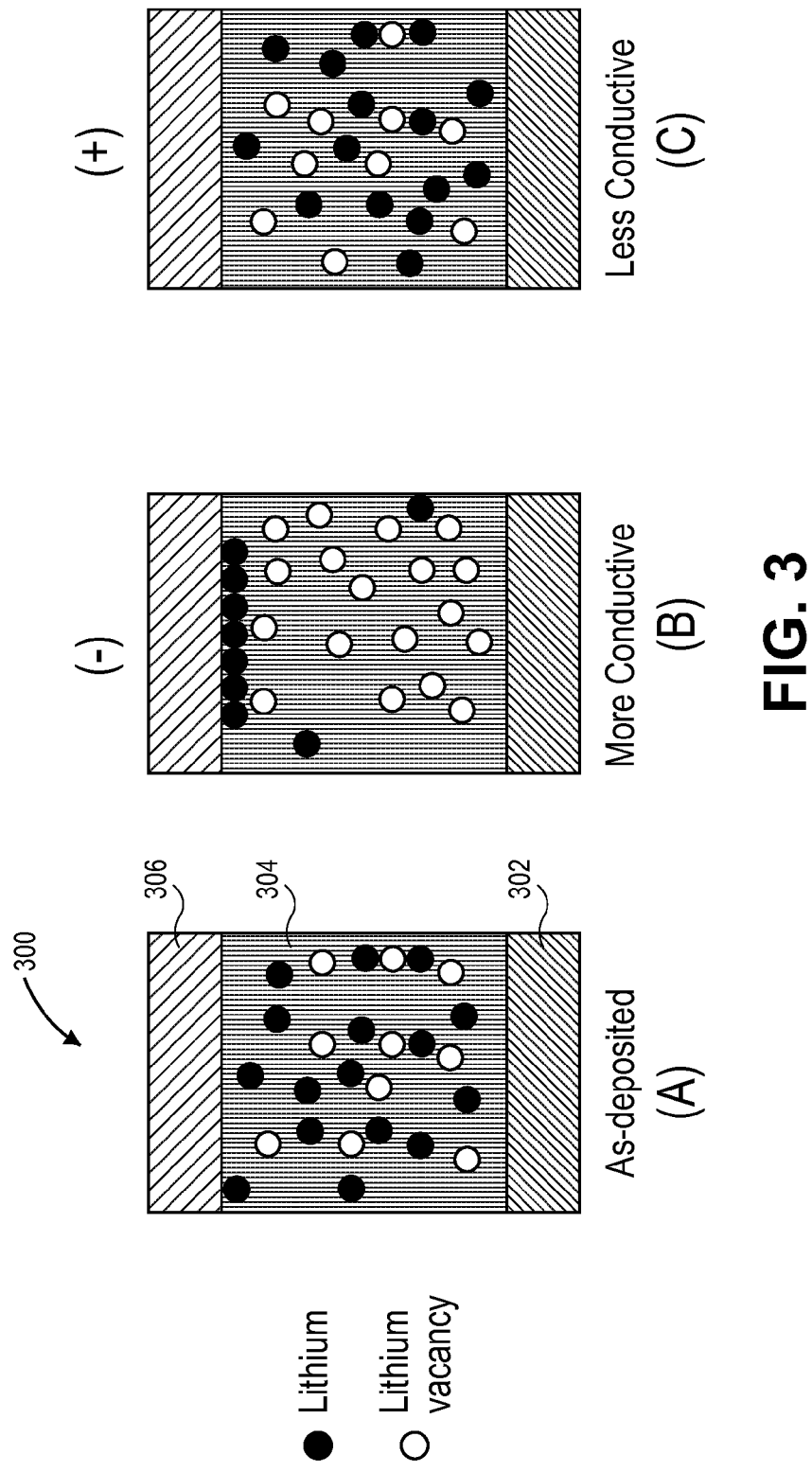
FIG. 3 illustrates a schematic representation of resistance change in a cationic-based conductive oxide layer induced by changing the concentration of cation vacancies in the conductive oxide layer, using an example of material with composition of $Li_xCoO_2$, in accordance with an embodiment of the present invention.

As an example, FIG. 3 illustrates a schematic representation of resistance change in a cationic-based conductive oxide layer induced by changing the concentration of cation vacancies (such as lithium cation vacancies) in the conductive oxide layer, in accordance with an embodiment of the present invention.

Referring to FIG. 3, a memory element 300 is shown as deposited (A). The memory element includes a cationic-based conductive oxide layer 304 between a bottom electrode 302 and a top electrode 306. In a specific example, the layer 304 is a lithium cobalt oxide layer, described in greater details below, and lithium atoms and lithium vacancies are distributed as shown in (A). Referring to (B) of FIG. 3, upon application of a negative bias, the memory element 300 can be made more conductive. In that state, lithium atoms migrate to the top electrode 306, while vacancies remain throughout the layer 304. Referring to (C) of FIG. 3, upon application of a positive bias to one of the electrodes, the memory element can be made less conductive. In that state, lithium atoms are distributed more evenly throughout layer 304. Accordingly, in an embodiment, effective composition (e.g., the location of lithium atoms (or cations) versus vacancies) of a cationic-based conductive oxide layer is modified to change resistance of a memory element, in some embodiments due to stoichiometry-induced Mott transition. In a specific embodiment, an applied electrical field, which drives such compositional change during write operation, is tuned to values approximately in the range of 1e6-1e7 V/cm.

In an embodiment, referring again to FIG. 3, the cationic-based conductive oxide layer 304 is composed of a material suitable for cation-based mobility within the layer itself. In a specific exemplary embodiment, layer 304 of FIG. 3 part (A) is composed of lithium cobalt oxide ($LiCoO_2$). Then, in part (B), the corresponding layer becomes lithium deficient (e.g., $Li_{<0.75}CoO_2$) when a negative bias is applied and lithium atoms (e.g., as cations) migrate toward electrode 306. By contrast, in part (C), the corresponding layer becomes lithium rich (e.g., $Li_{>0.95}CoO_2$) when a positive bias is applied and lithium atoms (e.g., as cations) migrate away from electrode 306. In other embodiments, other suitable compositions with cationic conductivity include, but are not limited to, $LiMnO_2$, $Li_4TiO_{12}$, $LiNiO_2$, $LiNbO_3$, $Li_3N$:H, $LiTiS_2$ (all of which are lithium atom or $Li^+$ mobility based), Na β-alumina (which is sodium atom or $Na^+$ mobility based), or AgI, $RbAg_4I_5$, AgGe-$AsS_3$ (all of which are silver atom or $Ag^+$ mobility based). In general, these examples provide materials based on cation mobility or migration, which is typically much faster than anionic-based mobility or migration (e.g., for oxygen atoms or $O^{2-}$ anions).

In an embodiment, referring again to FIG. 3, one electrode (e.g., bottom electrode 302) in a memory element including a cationic conductive oxide layer is a noble metal based electrode. In one embodiment, examples of suitable noble metals include, but are not limited to palladium (Pd) or platinum (Pt). In a specific embodiment, a memory stack includes a bottom electrode composed of an approximately 10 nanometer thick Pd layer. It is to be understood that use of the terms "bottom" and "top" for electrodes 302 and 306 need only be relative and are not necessarily absolute with respect to, e.g., an underlying substrate.

In an embodiment, referring again to FIG. 3, the other electrode (e.g., top electrode 306) in a memory element including a cationic conductive oxide layer is an "intercalation host" for migrating cations. The material of the top electrode is a host in a sense that the material is conductive with or without the presence of the migrating cations and is not substantially altered in the absence or presence of the migrating cations. In an exemplary embodiment, the top electrode is composed of a material such as, but not limited to, graphite, or metal chalcogenides such as disulfides (e.g., $TaS_2$). Such materials are conductive as well as absorbing of cations such as $Li^+$. This is in contrast to an electrode for an anionic based conductive oxide which may include a metal with a corresponding conductive oxide to accommodate migrating oxygen atoms or anions.

Figure 4:
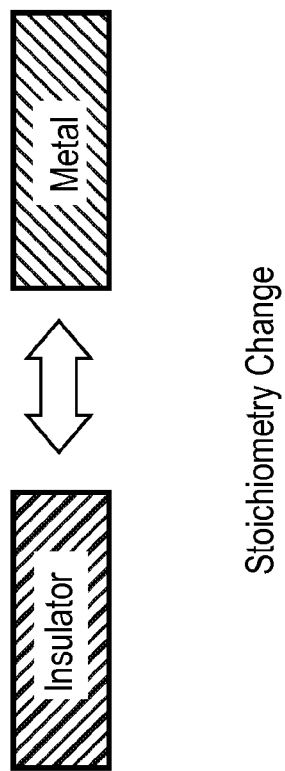
FIG. 4 illustrates a fundamental phenomenon of a stoichiometry change for a cationic-based conductive oxide material, in accordance with an embodiment of the present invention.

It is to be understood that very subtle compositional changes in a cationic-based conductive oxide material may provide suitable differences in resistivity for sensing a "state" change between less or more conductive. FIG. 4 illustrates a fundamental phenomenon of a stoichiometry change for a cationic-based conductive oxide material, in accordance with an embodiment of the present invention. Referring to FIG. 4, stoichiometric changes in a film or material layer may make all the difference between the behavior, in a relative sense, being either that of an "insulator" (higher resistivity) and that of a "metal" (lower resistivity. In a specific exemplary embodiment, $Li_{>0.95}CoO_2$ is more resistive ("insulator"), while $Li_{<0.75}CoO_2$ less resistive ("metal").

One of the differences of one or more embodiments described herein with respect to state of the art resistive devices is that all layers in the stack of the memory element are composed of conducting thin films. As a result, the device structure for the resulting resistive memory element is different from the state of the art devices where at least one of the films is an insulator and/or dielectric film. For such films in the conventional devices, the resistivity is many orders of magnitude higher than that of metals or metal compounds and is essentially non measurable at low field until the device is formed. However, in embodiments described herein, since all layers in the memory element are conductors, the arrangement enables one or more of the following: (1) low voltage operation, e.g., less than 1 Volt operation; (2) elimination of the need for a one time high voltage, commonly called forming voltage, required for state of the art RRAM; and (3) low resistances (e.g., since all components are conductors) which can provide for fast read in operation of a memory device having the cationic-based MCOM structure.

In an embodiment, a memory element including a cationic-based conductive oxide layer is fabricated by a process flow including a capacitor flow for which all active layers are deposited in situ to eliminate contamination related effects. Memory operation can be performed at voltages at or below DC 1V. In one embodiment, the fabricated device does not require application of initial high voltage DC sweep, e.g., as is known as first fire for conventional devices.

Referring again to the description associated with FIGS. 1-4 above, a stack of conductive layers including a cationic-based conductive metal oxide layer may be used to fabricate as memory bit cell. For example, FIG. 5 illustrates a schematic of a memory bit cell 500 which includes a cationic-based metal-conductive oxide-metal (MCOM) memory element 510, in accordance with an embodiment of the present invention.

Figure 5:
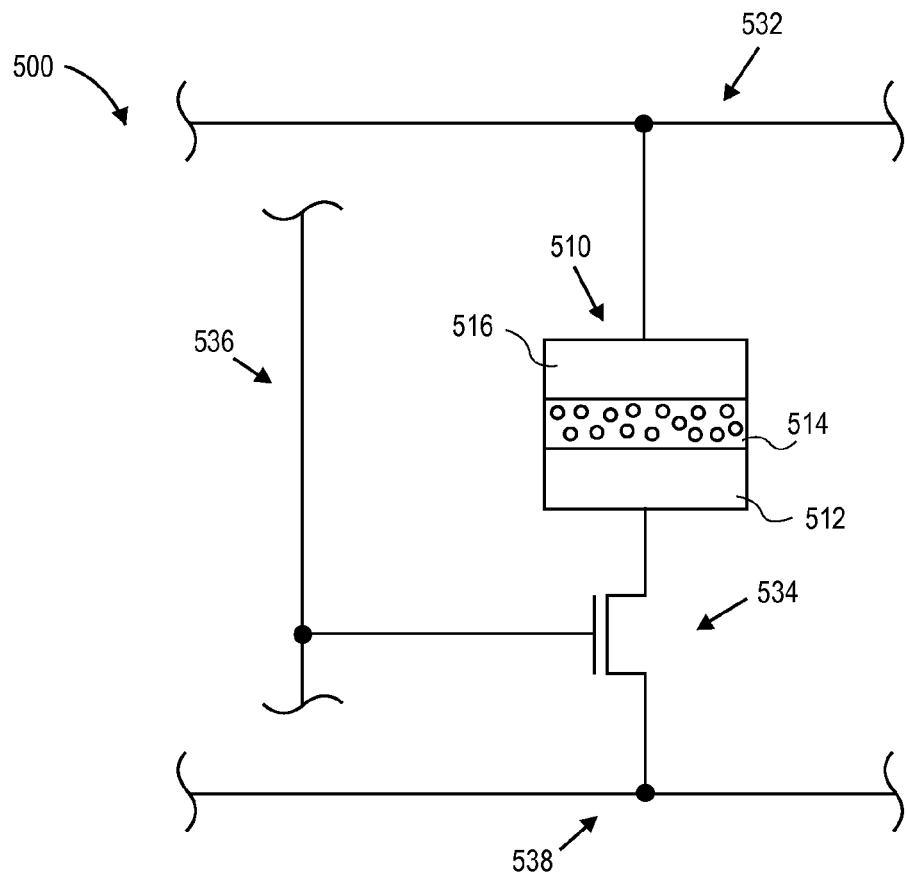
FIG. 5 illustrates a schematic of a memory bit cell which includes a cationic-based metal-conductive oxide-metal (MCOM) memory element, in accordance with an embodiment of the present invention.

Referring to FIG. 5, the cationic-based MCOM memory element 510 may include a first conductive electrode 512 with a cationic-based conductive metal oxide layer 514 adjacent the first conductive electrode 512. A second conductive electrode 516 is adjacent the cationic-based conductive metal oxide layer 514. The second conductive electrode 516 may be electrically connected to a bit line 532. The first conductive electrode 512 may be coupled with a transistor 534. The transistor 534 may be coupled with a word line 536 and a source line 538 in a manner that will be understood to those skilled in the art. The memory bit cell 500 may further include additional read and write circuitry (not shown), a sense amplifier (not shown), a bit line reference (not shown), and the like, as will be understood by those skilled in the art, for the operation of the memory bit cell 500. It is to be understood that a plurality of the memory bit cells 500 may be operably connected to one another to form a memory array (not shown), wherein the memory array can be incorporated into a non-volatile memory device. It is to be understood that the transistor 534 may be connected to the second conductive electrode 516 or the first conductive electrode 512, although only the latter is shown.

Switching time for memory bit cell 500 may be relatively fast. In an exemplary embodiment, the cationic-based conductive metal oxide layer 514 has a cationic mobility of approximately 6.25E-05 cm2V·s, and the appropriate electrode has an intercalation time of approximately 4E-09 seconds. This corresponds to an estimated write time of approximately 4 nanoseconds for the memory bit cell 500.

Figure 6:
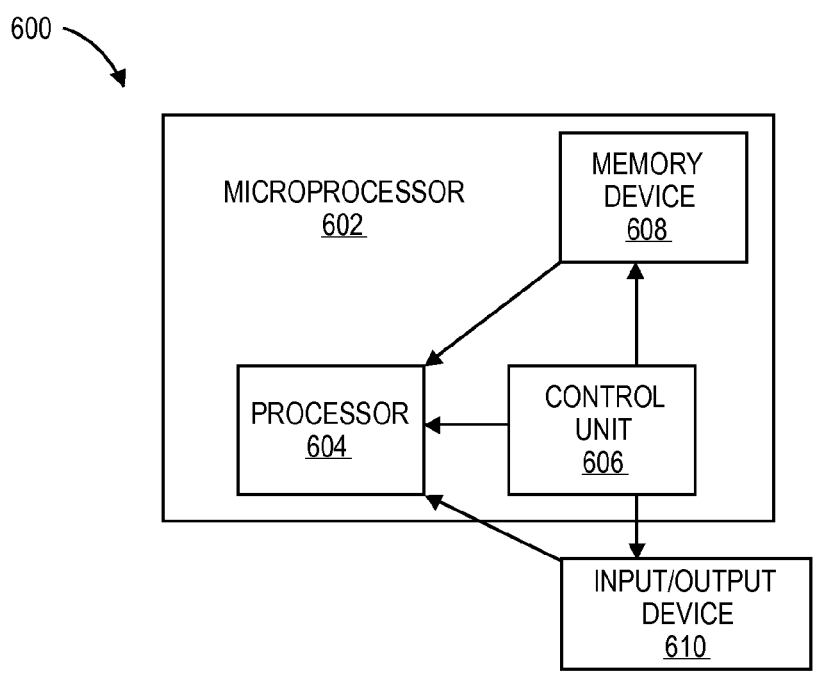
FIG. 6 illustrates a block diagram of an electronic system, in accordance with an embodiment of the present invention.

FIG. 6 illustrates a block diagram of an electronic system 600, in accordance with an embodiment of the present invention. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be understood that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a memory element having a cationic-based conductive oxide and electrode stack as described in the present description. In an embodiment, the memory device 608 is embedded in the microprocessor 602, as depicted in FIG. 6.

Figure 7:
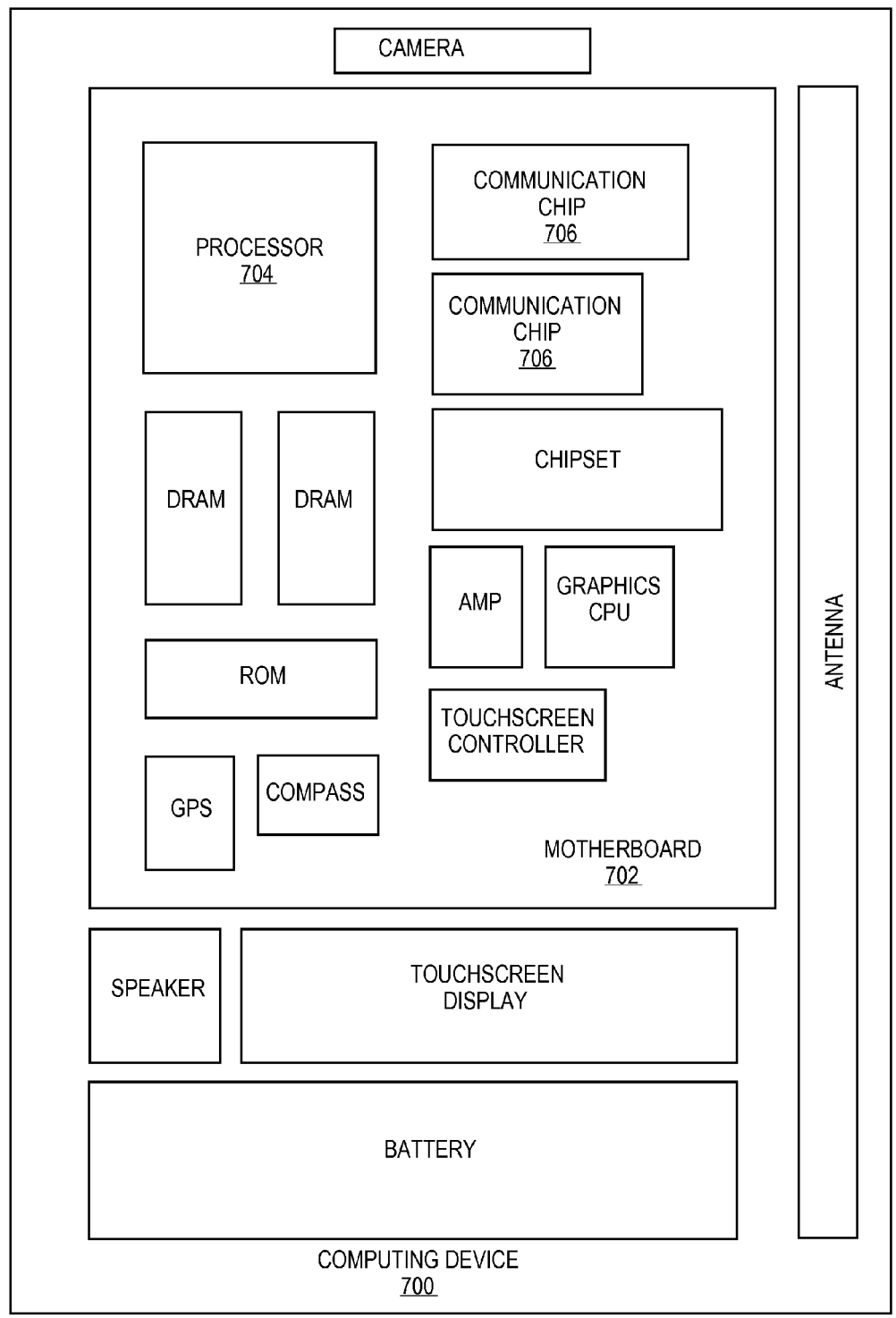
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes, or is electrically coupled with, one or more devices low voltage embedded memory having cationic-based conductive oxide and electrode stacks in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes, or is electrically coupled with, one or more devices low voltage embedded memory having cationic-based conductive oxide and electrode stacks in accordance with implementations of the invention.

In further implementations, another component housed within the computing device 700 may contain an integrated circuit die that includes, or is electrically coupled with, one or more devices low voltage embedded memory having cationic-based conductive oxide and electrode stacks in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Accordingly, one or more embodiments of the present invention relate generally to the fabrication of microelectronic memory. The microelectronic memory may be non-volatile, wherein the memory can retain stored information even when not powered. One or more embodiments of the present invention relate to the fabrication of a memory element having a cationic-based conductive oxide and electrode stack for non-volatile microelectronic memory devices. Such an element may be used in an embedded non-volatile memory, either for its non-volatility, or as a replacement for embedded dynamic random access memory (eDRAM). For example, such an element may be used for, or in place of, 1T-1X memory (X=capacitor or resistor) at competitive cell sizes within a given technology node.

Thus, embodiments of the present invention include low voltage embedded memory having cationic-based conductive oxide elements.

In an embodiment, a material layer stack for a memory element includes a first conductive electrode. A cationic-based conductive oxide layer is disposed on the first conductive electrode. The cationic-based conductive oxide layer has a plurality of cation vacancies therein. A second electrode is disposed on the cationic-based conductive oxide layer.

In one embodiment, the cationic-based conductive oxide layer is composed of a material having cation-based mobility.

In one embodiment, the material having cation-based mobility has lithium ($Li^+$), sodium ($Na^+$) or silver ($Ag^+$) mobility.

In one embodiment, the material having cation-based mobility has lithium ($Li^+$) mobility and is a material such as, but not limited to, $LiCoO_2$, $LiMnO_2$, $Li_4TiO_{12}$, $LiNiO_2$, $LiNbO_3$, $Li_3N:H$ or $LiTiS_2$.

In one embodiment, the material having cation-based mobility has sodium ($Na^+$) mobility and is Na β-alumina.

In one embodiment, the material having cation-based mobility has silver ($Ag^+$) mobility and is a material such as, but not limited to, $AgI$, $RbAg_4I_5$ and $AgGeAsS_3$.

In one embodiment, the resistivity of the cationic-based conductive oxide layer is approximately in the range of 10 mOhm cm-10 kOhm when measured at a low field of approximately 0.1V.

In one embodiment, the second electrode is composed of a material that is an intercalation host for cations.

In one embodiment, the material that is an intercalation host for cations is one such as, but not limited to, graphite or a metal chalcogenide.

In one embodiment, the first electrode is a noble metal electrode.

In one embodiment, the noble metal electrode is composed of a material such as, but not limited to, palladium (Pd) or platinum (Pt).

In an embodiment, a non-volatile memory device includes a first conductive electrode. A cationic-based conductive oxide layer is disposed on the first conductive electrode. A second electrode is disposed on the cationic-based conductive oxide layer. A transistor is electrically connected to the first or the second electrode, a source line, and a word line. A bit line is electrically coupled with the other of the first or the second electrode.

In one embodiment, the cationic-based conductive oxide layer has a plurality of cation vacancies therein.

In one embodiment, the cationic-based conductive oxide layer is composed of a material having cation-based mobility.

In one embodiment, the material having cation-based mobility has lithium ($Li^+$), sodium ($Na^+$) or silver ($Ag^+$) mobility.

In one embodiment, the material having cation-based mobility has lithium ($Li^+$) mobility and is one such as, but not limited to, $LiCoO_2$, $LiMnO_2$, $Li_4TiO_{12}$, $LiNiO_2$, $LiNbO_3$, $Li_3N:H$ or $LiTiS_2$.

In one embodiment, the material having cation-based mobility has sodium ($Na^+$) mobility and is Na β-alumina.

In one embodiment, the material having cation-based mobility has silver ($Ag^+$) mobility and is one such as, but not limited to, $AgI$, $RbAg_4I_5$ and $AgGeAsS_3$.

In one embodiment, the resistivity of the cationic-based conductive oxide layer is approximately in the range of 10 mOhm cm-10 kOhm when measured at a low field of approximately 0.1V.

In one embodiment, the second electrode comprises a material that is an intercalation host for cations.

In one embodiment, the material that is an intercalation host for cations is one such as, but not limited to, graphite or a metal chalcogenide.

In one embodiment, the first electrode is a noble metal electrode.

In one embodiment, the noble metal electrode is composed of a material such as, but not limited to, palladium (Pd) or platinum (Pt).

In an embodiment, a method of operating a non-volatile memory device includes applying a positive bias to a memory element. The memory element includes a first conductive electrode, a cationic-based conductive oxide layer disposed on the first conductive electrode, and a second electrode disposed on the cationic-based conductive oxide layer. The method also includes changing the cationic-based conductive oxide layer from a more conductive state to a less conductive state by the applying.

In one embodiment, the cationic-based conductive oxide layer includes lithium atoms and lithium vacancies, and changing the cationic-based conductive oxide layer from the more conductive state to the less conductive state includes migrating the lithium atoms from one of the electrodes toward the bulk of the cationic-based conductive oxide layer.

In one embodiment, changing the cationic-based conductive oxide layer from the more conductive state to the less conductive state includes causing a change in composition of the cationic-based conductive oxide layer.

In one embodiment, applying the positive bias includes applying a bias of less than absolute 1V.

In an embodiment, a method of operating a non-volatile memory device includes applying a negative bias to a memory element. The memory element includes a first conductive electrode, a cationic-based conductive oxide layer disposed on the first conductive electrode, and a second electrode disposed on the cationic-based conductive oxide layer. The method also includes changing the cationic-based conductive oxide layer from a less conductive state to a more conductive state by the applying.

In one embodiment, the cationic-based conductive oxide layer includes lithium atoms and lithium vacancies, and changing the cationic-based conductive oxide layer from the less conductive state to the more conductive state includes migrating the lithium atoms from the bulk of the cationic-based conductive oxide layer toward one of the electrodes.

In one embodiment, changing the cationic-based conductive oxide layer from the less conductive state to the more conductive state includes causing a change in composition of the cationic-based conductive oxide layer.

In one embodiment, applying the negative bias includes applying a bias of less than absolute 1V.

What is claimed is:

1. A non-volatile memory device, comprising:
   a first conductive electrode;
   a cationic-based conductive oxide layer disposed on the first conductive electrode; and
   a second electrode disposed on the cationic-based conductive oxide layer;
   a transistor electrically connected to the first or the second electrode, a source line, and a word line; and
   a bit line electrically coupled with the other of the first or the second electrode.

2. The non-volatile memory device of claim 1, wherein the cationic-based conductive oxide layer has a plurality of cation vacancies therein.

3. The non-volatile memory device of claim 1, wherein the cationic-based conductive oxide layer comprises a material having cation-based mobility.

4. The non-volatile memory device of claim 3, wherein the material having cation-based mobility has lithium ($Li^+$), sodium ($Na^+$) or silver ($Ag^+$) mobility.

5. The non-volatile memory device of claim 4, wherein the material having cation-based mobility has lithium ($Li^+$) mobility and is selected from the group consisting of $LiCoO_2$, $LiMnO_2$, $Li_4TiO_{12}$, $LiNiO_2$, $LiNbO_3$, $Li_3N$:H and $LiTiS_2$.

6. The non-volatile memory device of claim 4, wherein the material having cation-based mobility has sodium ($Na^+$) mobility and is Na β-alumina.

7. The non-volatile memory device of claim 4, wherein the material having cation-based mobility has silver ($Ag^+$) mobility and is selected from the group consisting of AgI, $RbAg_4I_5$ and $AgGeAsS_3$.

8. The non-volatile memory device of claim 1, wherein the resistivity of the cationic-based conductive oxide layer is approximately in the range of 10 mOhm cm-10 kOhm when measured at a low field of approximately 0.1V.

9. The non-volatile memory device of claim 1, wherein the second electrode comprises a material that is an intercalation host for cations.

10. The non-volatile memory device of claim 9, wherein the material is selected from the group consisting of graphite and a metal chalcogenide.

11. The non-volatile memory device of claim 1, wherein the first electrode is a noble metal electrode.

12. The non-volatile memory device of claim 11, wherein the noble metal electrode comprises a material selected from the group consisting of palladium (Pd) and platinum (Pt).

13. A method of operating a non-volatile memory device, the comprising:
   applying a positive bias to a memory element, the memory element comprising a first conductive electrode, a cationic-based conductive oxide layer disposed on the first conductive electrode, and a second electrode disposed on the cationic-based conductive oxide layer; and
   changing the cationic-based conductive oxide layer from a more conductive state to a less conductive state by the applying.

14. The method of claim 13, wherein the cationic-based conductive oxide layer includes lithium atoms and lithium vacancies, and wherein changing the cationic-based conductive oxide layer from the more conductive state to the less conductive state comprises migrating the lithium atoms from one of the electrodes toward the bulk of the cationic-based conductive oxide layer.

15. The method of claim 13, wherein changing the cationic-based conductive oxide layer from the more conductive state to the less conductive state comprises causing a change in composition of the cationic-based conductive oxide layer.

16. The method of claim 13, wherein applying the positive bias comprises applying a bias of less than absolute 1V.

17. A method of operating a non-volatile memory device, the comprising:
   applying a negative bias to a memory element, the memory element comprising a first conductive electrode, a cationic-based conductive oxide layer disposed on the first conductive electrode, and a second electrode disposed on the cationic-based conductive oxide layer; and
   changing the cationic-based conductive oxide layer from a less conductive state to a more conductive state by the applying.

18. The method of claim 17, wherein the cationic-based conductive oxide layer includes lithium atoms and lithium vacancies, and wherein changing the cationic-based conductive oxide layer from the less conductive state to the more conductive state comprises migrating the lithium atoms from the bulk of the cationic-based conductive oxide layer toward one of the electrodes.

19. The method of claim 17, wherein changing the cationic-based conductive oxide layer from the less conductive state to the more conductive state comprises causing a change in composition of the cationic-based conductive oxide layer.

20. The method of claim 17, wherein applying the negative bias comprises applying a bias of less than absolute 1V.

* * * * *